United States Patent
Rapeli

[11] Patent Number: 5,831,303
[45] Date of Patent: Nov. 3, 1998

[54] FIELD EFFECT TRANSISTOR UTILIZING THE GATE STRUCTURE TWO-DIMENSIONALLY

[75] Inventor: Juha Rapeli, Oulu, Finland

[73] Assignee: Nokia Mobile Phones, Ltd., Espoo, Finland

[21] Appl. No.: 679,343

[22] Filed: Jul. 10, 1996

[30] Foreign Application Priority Data

Jul. 14, 1995 [FI] Finland ................................. 953433

[51] Int. Cl.$^6$ ............................................. H01L 29/788
[52] U.S. Cl. ........................ 257/316; 257/270; 257/275; 257/280; 257/281
[58] Field of Search .................................. 257/316, 270, 257/275, 280, 281; 327/105, 113, 116, 119, 121, 355, 356

[56] References Cited

U.S. PATENT DOCUMENTS

| | | | |
|---|---|---|---|
| 4,067,001 | 1/1978 | Hoffmann | 365/174 |
| 4,077,044 | 2/1978 | Hayashi | 357/23 |
| 4,143,387 | 3/1979 | Stikvoort | 358/23 |
| 4,602,170 | 7/1986 | Bertin | 307/450 |
| 5,001,372 | 3/1991 | Nyqvist | 307/529 |
| 5,274,256 | 12/1993 | Shiga | 257/270 |
| 5,289,059 | 2/1994 | Pikkarainen | 307/520 |
| 5,365,119 | 11/1994 | Kivari | 327/115 |
| 5,379,458 | 1/1995 | Vaisanen | 455/330 |
| 5,387,874 | 2/1995 | Rapeli | 327/337 |
| 5,390,223 | 2/1995 | Lindholm | 377/49 |
| 5,416,435 | 5/1995 | Jokinen et al. | 327/113 |
| 5,430,895 | 7/1995 | Huusko | 455/327 |
| 5,497,116 | 3/1996 | Rapeli | 327/337 |
| 5,602,501 | 2/1997 | Shiga | 327/105 |

*Primary Examiner*—Carl W. Whitehead, Jr.
*Attorney, Agent, or Firm*—Perman & Green, LLP

[57] ABSTRACT

The object of the invention is a field-effect transistor comprising a drain (D) and a source (S) and a gate (G) with a determined width (W) and length (L), equipped with means (G1–G2) for generating a voltage distribution on the gate in direction of its width. The gate comprises a first end in direction of its width and a second end essentially opposite to the first end, and that a first gate contact (G1) is arranged at the first end for providing a first voltage ($V_{G1}$) to the first end, and a second gate contact (G2) is arranged at the second end for providing a second voltage ($V_{G2}$) to the second end, for generating a voltage distribution on the gate in direction of its width with the help of a difference voltage ($V_{G1}-V_{G2}$) between the first (G1) and the second (G2) gate contact. On the basis of the first ($V_{G1}$) and second ($V_{G2}$) voltage, a determined common-mode voltage is obtained on the gate, by which the voltage level of the gate is adjusted, and the difference voltage can be used for the adjustment of the voltage distribution in the width direction of the gate. In addition, a third gate contact (G3) can be arranged on the gate for generating a determined potential ($V_{G3}$) as a common voltage evenly over the entire gate area. As an output ($I_{DS}$), a signal proportional to the product of the difference voltage ($V_{G1}-V_{G2}$) and common-mode voltage is obtained from the field-effect transistor thereby forming a multiplier.

10 Claims, 9 Drawing Sheets

FIELD EFFECT TRANSISTOR UTILIZING THE GATE STRUCTURE TWO-DIMENSIONALLY

BACKGROUND OF THE INVENTION

The invention concerns a new kind of field-effect transistor comprising a drain and source as well as a gate with a determined width and length, the length of said gate being formed in a direction parallel with the axis going through the drain and source. The invention also concerns a multiplier comprising such a field-effect transistor.

A field-effect transistor is commonly known as a three-terminal component (FIG. 1a, 1c) whose terminals are a gate (G), a source (S), and a drain (D). In FIG. 1b, a cross section can be seen that clarifies the vertical structure of the field-effect transistor where the gate 10 is on top of a non-conductive layer 11, and a channel 14 is formed in the semiconductor material between the drain (D) and the source (S) 13 of the semiconductor material, both of which are diffused and have high conductivity. When the gate voltage $V_{GS}$ is suitable, a conductive channel is formed under the gate of the transistor, and the current flowing through the channel is approximated as $$I_{DS} = K \frac{W}{L} \left[ (V_{GS} - V_T)(V_D - V_S) - \frac{1}{2} V_D^2 + \frac{1}{2} V_S^2 \right] \quad (1)$$

Here L denotes the channel length, in other words normally the gate length formed between the drain D and source S in the direction of the axis passing through them, W is the channel width, ie. usually the gate width, which is perpendicular towards the length ie. parallel with the drain D and source S, $V_{GS}$ is the voltage between gate G and source S, $V_D$ is the potential on the drain D, $V_S$ is the potential on the source S, and $V_T$ is the threshold voltage typical for a field-effect transistor. In the case when $V_{DS} < V_p$, where $V_p$ is the so called pinch-off voltage, the transistor is in the linear, so called triode region and with very high precision, $I_{DS}$ is $$I_{DS} = K \frac{W}{L} (V_{GS} - V_T)(V_D - V_S). \quad (1')$$

When $V_{DS} > V_p$ or the transistor is in a so-called saturation region with $$I_{DS} = K \frac{W}{2L} (V_{GS} - V_T)^2, \quad (2)$$

$V_G$ is gate voltage, $V_D$ is drain voltage, $V_S$ is source voltage and $V_{GS}$ is the voltage between the gate and source. K is a coefficient made up from the mobility of charge in the channel and the capacitance density between the gate and the channel, $V_T$ is threshold voltage and $V_p$ is so-called pinch-off voltage with an approximate value of $V_p = V_{GS} - V_T$. W is the width of the channel and L is the length between the channel's drain (D) and source (S) in accordance with FIG. 1.

The function of a known field-effect transistor has been explained in more detail in 'Analysis and Design of Analog Integrated Circuits' by P. R. Gray, R. G. Meyer (pp. 59–64, published by J. Wiley & Sons, 1992). The enclosed FIG. 2 shows, in accordance with equations 1, 1' and 2, the current/voltage curve cluster of the field-effect transistor in a simplified form for gate voltages of different sizes.

It is generally assumed that the electrical conductivity of the gate G is good, and that the entire gate has therefore uniform voltage. This is the case for field-effect transistors with metal gates and, most often, also for silicon gates.

SUMMARY OF THE INVENTION

The usability and application areas of the traditional field-effect transistor are expanded by the invention, so that, with the help of additional electrodes, a voltage distribution is generated instead of uniform voltage on the gate of the transistor; and particularly and optionally a situation is created where in one direction on the gate there is, in relation to distance, a distribution of voltage (for example, linearly increasing or decreasing), and, perpendicularly to the above-mentioned direction, there is another distribution of voltage, which is dependent on the location (for example constant) and these distributions are essentially summed in the two-dimensional geometry of the space. By causing a voltage distribution on the transistor gate in direction of its width according to the invention, this voltage distribution can be used to affect the actual channel width of the transistor and thus the current passing through the transistor, in other words, we can say that the transistor "size" can be adjusted by the voltage distribution. Consequently, even if the gate dimensions were: width W=100μm and length L=1 μm, by the voltage distribution we can create a channel with eg. the following dimensions: width W=80 μm and length L=1 μm, ie. the voltage distribution can be used for creating a channel of desired size.

The voltage distribution in the direction of the gate width can be realized by providing contacts at both ends of the gate in direction of its width and by introducing different potentials at each end in order to create an offset voltage. In addition, a gate potential evenly spread over the entire gate area can be introduced to the gate and summed with the above-mentioned offset voltage.

The field-effect transistor in accordance with the invention is characterized in that the gate is provided with means for generating a voltage distribution on the gate in direction of its width. On the basis of such a field effect transistor, a multiplier is provided. Briefly described, the multiplier for multiplying a first and a second multiplier signal by each other comprises a field-effect transistor comprising a drain and a source and a gate with a determined width and length, said gate length being formed in direction of an axis going through the drain and the source, the gate being provided with means for generating a voltage distribution on the gate in direction of its width and with means for creating a common-mode potential in the gate area, the first multiplier signal being a signal proportional to said voltage distribution and the second multiplier signal being proportional to said common-mode potential.

BRIEF DESCRIPTION OF THE DRAWINGS

The invention is described in greater detail below, by referring to the enclosed drawings, in which.

DETAILED DESCRIPTION OF THE PREFERRED EMBODIMENTS

Figure 3:
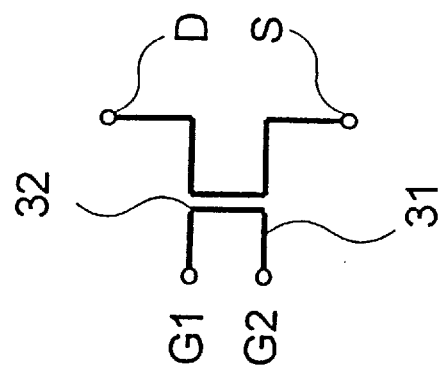
FIG. 3 shows the principle of the field-effect transistor in accordance with the invention at a symbolic level.
Figure 2:
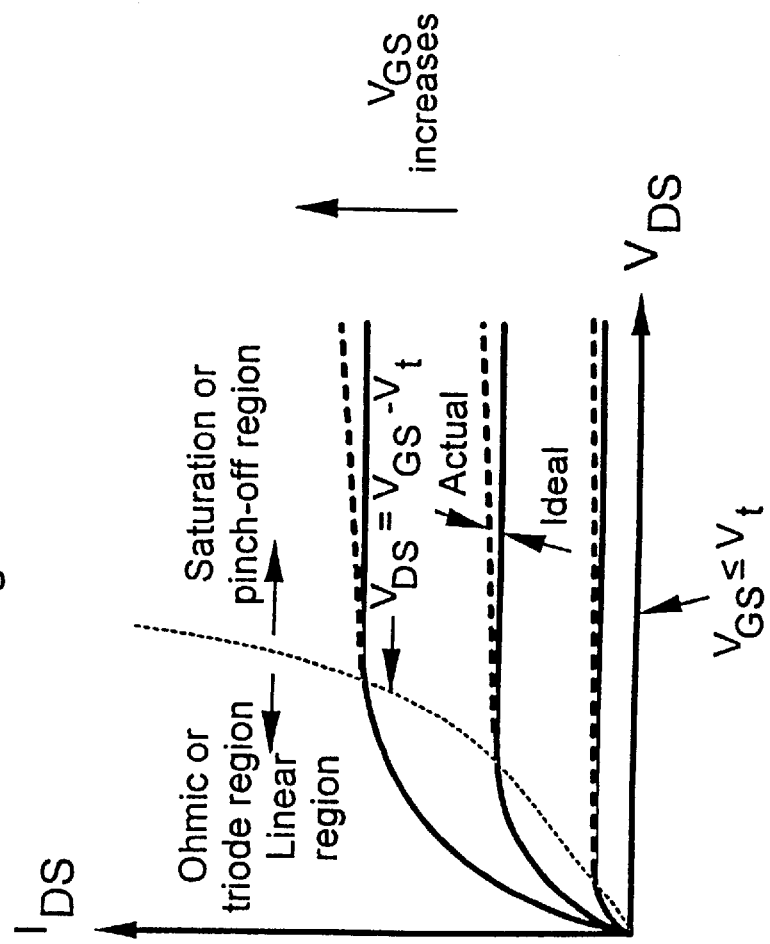
FIG. 2 shows the current voltage curves of a known field-effect transistor with gate voltage used as parameter.
Figure 4:
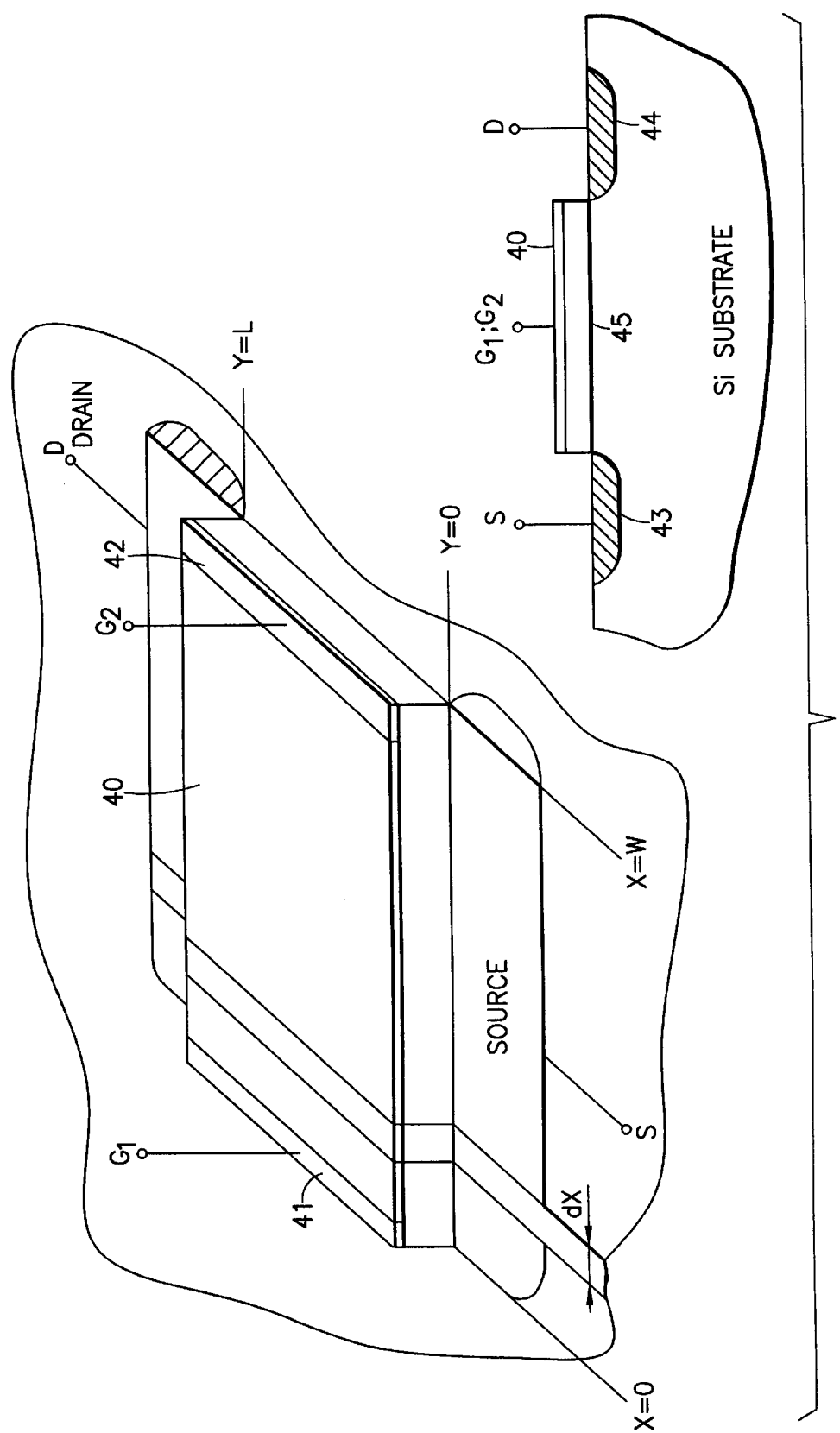
FIG. 4 shows the structure and cross section of a field-effect transistor in accordance with the invention.

The circuit in FIG. 3 shows a transistor in accordance with the invention, and FIG. 4 shows its physical realisation. According to the invention, the function is based on the fact that the conductivity of gate 40 (FIG. 4), which is made of silicon (normally polycrystalline silicon), is relatively low, and therefore, a voltage difference can be generated between the gate contacts $G_1$ (41) and $G_2$ (32). FIG. 4 also indicates the source (S) 43, the drain (D) 44 and the formed channel 45 of the field-effect transistor. Let the electrode voltages be $V_D, V_S, V_{G1}$ and $V_{G2}$ in FIG. 4 and the threshold voltage VT characteristic for the said field-effect transistors. Furthermore, let the distance between electrodes G1 and G2 be the same as the width of the field-effect transistor W, which, according to FIG. 4, is indicated as the x direction. It is also assumed that a transverse voltage component in regard to the x direction is brought on the gate, for example, alternating voltage υ, which is added at each point to the distribution of voltage in the x direction. The distribution of voltage υ can be brought on the gate either as a common voltage of gate contacts G1 ja G2 or by a specific arrangement, realizing a third gate contact G3, which will be discussed later in connection with FIGS. 8 and 9. Let us examine the function of the transistor on the basis of a simplified current/voltage equation (1), which was presented above. The examination is carried out with the help of a N type field-effect transistor, where the threshold voltage $V_T$ and the gate voltages $V_{G1}$ ja $V_{G2}$ are generally positive. The examination is also valid for P channel transistors where equivalent voltages are negative.

Figure 5:
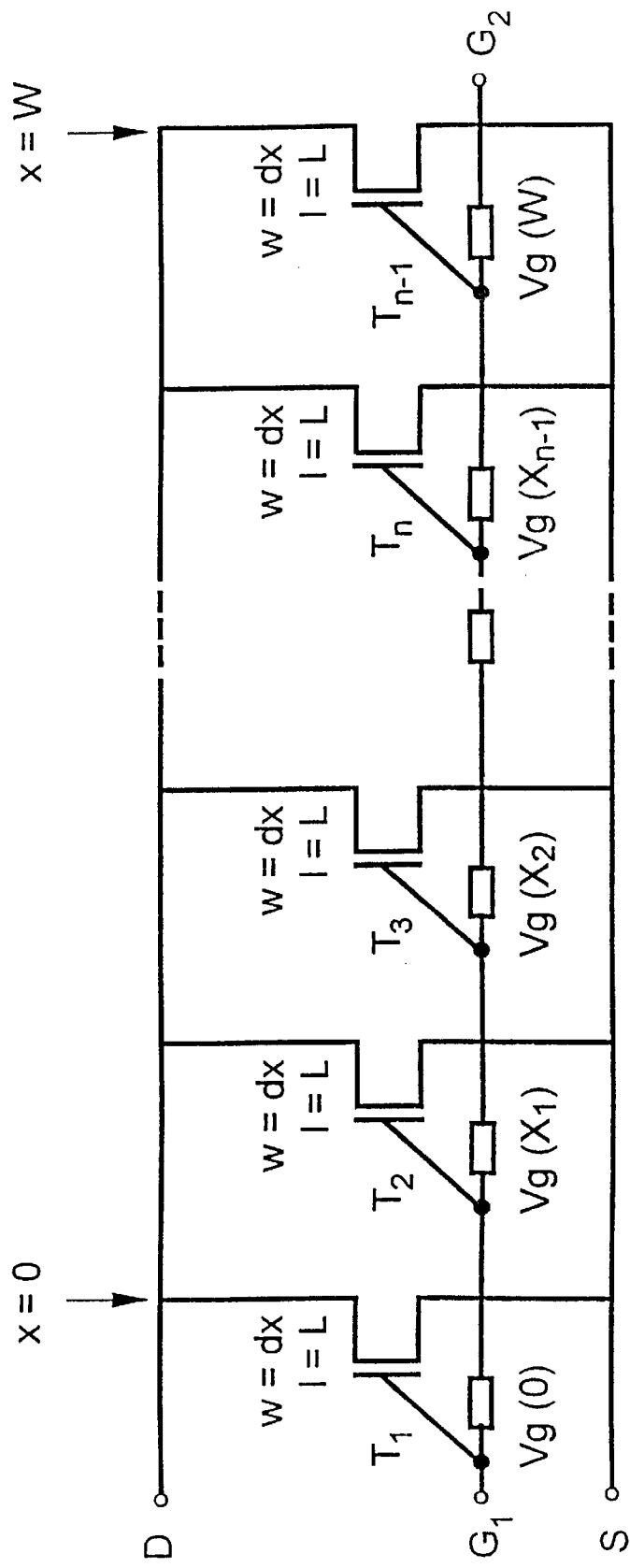
FIG. 5 shows the size of a width of the field-effect transistor as a parallel connection of several elementary transistors.

According to the invention, the voltage distribution caused in the direction of the width of the gate can be used to realise a channel of a desired size in the x-direction (in direction of the gate width), and therefore it can be said that the connection in FIGS. 3 and 4 correspond to the situation in FIG. 5 where a large number of elementary transistors are connected parallel, so that the source and drain voltages $V_D$, $V_S$ are the same for all transistors, the width W=dx of each elementary transistor and the gate voltage at some point x in the direction of x equals $$V_G(x) = V_{G1} + \frac{V_{G2} - V_{G1}}{W} x + v. \tag{3}$$

The contribution of each elementary transistor, whose width is dx, to the total current flowing through the entire transistor is $$\begin{cases} dI_{DS}(x) = 0, \text{ when } V_G(x) - V_S < V_T \\ dI_{DS}(x) = K \frac{dx}{L} (V_G(x) - V_S - V_T)(V_D - V_S), \text{ when } V_G(x) - V_S \geq V_T \end{cases} \tag{4}$$

First, when it is assumed that all individual elementary transistors T1 ... Tn+1 of this transistor remain in the linear i.e. the so called triode region according to equation (1), the total current is arrived at by integrating the equation (3) over those values of X, for which $V_G(x) - V_S \geq V_T$. For practical reasons, it is assumed that $V_{G2}$ is greater than $V_{G1}$, in which case the upper limit of the integration will be W, and from equation (3) we achieve a lower limit of $$x_a = W \frac{(V_S + V_T - V_{G1} - v)}{V_{G2} - V_{G1}} \tag{5}$$

and, correspondingly, for the total current $$I_{DS} = \frac{K}{L} \int_{x_a}^{Q} \left( V_{G1} + \frac{V_{G2} - V_{G1}}{W} x + v - V_S - V_T \right) (V_D - V_S) dx \tag{6}$$

which is divided into a linear component $$I_1 = \frac{K}{L} (V_{G1} + v - V_S - V_T)(V_D - V_S) \int_{x_a}^{Q} dx \tag{7}$$

and a quadratic component $$I_2 = \frac{K}{L} \left( \frac{V_{G2} - V_{G1}}{W} \right) (V_D - V_S) \int_{x_a}^{W} x\, dx \tag{8}$$

The value of integral $$\int_{x_a}^{W} dx$$

belonging to equation (7) is $W - x_a$, and by substituting the value for $x_a$ of equation (5) into this, the following is arrived at $$\int_{x_a}^{W} dx = W \frac{(V_{G2} - V_S - V_T + v)}{V_{G2} - V_{G1}} \tag{9}$$

or as the current component $I_1$, the following is arrived at $$I_1 = K \frac{W}{L} (V_D - V_S)(V_{G1} - V_T - V_S + v) \frac{(V_{G2} - V_S - V_T + v)}{V_{G2} - V_{G1}} \tag{10}$$

The value of the integral $$\int_{x_a}^{W} x\, dx$$

belonging to equation (8) is $$\frac{1}{2}(W^2 - x_a^2),$$

and by replacing the term $x_a$ with equation (5), the following is arrived at $$\int_{x_a}^{W} x\,dx = \frac{1}{2} \frac{W^2}{(V_{G2}-V_{G1})^2} [(V_{G2}-V_{G1})^2 - (V_{G1}-V_S-V_T+\upsilon)^2] \quad (11)$$

and, correspondingly, the following is arrived at as the quadratic current component $I_2$ $$I_2 = \frac{1}{2} K\frac{W}{L}(V_D-V_S)\left[\frac{(V_{G2}-V_{G1})^2-(V_{G1}-V_S-V_T+\upsilon)^2}{V_{G2}-V_{G1}}\right] \quad (12)$$

When denoting $V_S+V_T-\upsilon=V_a$, the total current $I_{DS}=I_1+I_2$ is $$I_{DS} = K\frac{W}{L}(V_D-V_S)\left[\frac{(V_{G2}-V_a)(V_{G1}-V_a)}{V_{G2}-V_{G1}} + \frac{1}{2}\frac{(V_{G2}-V_{G1})^2}{V_{G2}-V_{G1}} - \frac{1}{2}\frac{(V_{G1}-V_a)^2}{V_{G2}-V_{G1}}\right] \quad (13)$$

and the following is arrived at as the numerator of the expression in square brackets $$a = V_{G2}V_{G1} - V_aV_{G2} - V_aV_{G1} + V_a^2 + \frac{1}{2}V_{G2}^2 + \frac{1}{2}V_{G1}^2 - V_{G2}V_{G1} - \frac{1}{2}V_{G1}^2 - \frac{1}{2}V_a^2 + V_aV_{G1}$$

which can be reduced to $$a = \frac{1}{2}V_a^2 - V_aV_{G2} + \frac{1}{2}V_{G2}^2 + \frac{1}{2}V_{G2}^2 = \frac{1}{2}(V_{G2}-V_a)^2 \quad (14)$$

in other words, the total equation of the current will be $$I_{DS} = K\frac{W}{L}(V_D-V_S)\frac{(V_{G2}-V_S-V_T+\upsilon)^2}{V_{G2}-V_{G1}} \quad (15)$$

which can alternatively be given as $$I_{DS} = K\frac{W}{L}(V_D-V_S)(V_{GS2}-V_T)\frac{V_{GS2}-V_T}{V_{G2}-V_{G1}} \quad (16)$$

where $V_{GS2} = V_{G2} - V_S$

The transistor described above, thus has a channel conductance of an equivalent controlled current source $$G = \frac{\partial}{\partial V_{DS}} I_{DS} = \frac{1}{2} K\frac{W}{L}(V_{GS2}-V_T)\frac{V_{GS2}-V_T}{V_{G2}-V_{G1}} \quad (17)$$

which is made up as the product of two factors: the linear factor of the denominator $$k_1 = V_{GS2} - V_T \quad (18)$$

and the bilinear factor $$k_2 = \frac{V_{GS2}-V_T}{V_{GS2}-V_T-(V_{GS1}-V_T)} \quad (19)$$

The equation includes two special cases: first, $V_{G2}=V_T$, in which case the equation (16) is reduced to a linear equation in the same way as the equation (1), and, secondly, $V_{GS1}>V_T$, in which case the boundary limits of the method presented above are no longer valid, ie. the transistor is no longer in the linear region. Physically, the case $V_{GS1}>V_T$ corresponds to a situation where the channel of the field-effect transistor has become as wide as the gate of the entire transistor. In this case, the changing of the offset voltage between the gate voltages $V_{G2}$ and $V_{G1}$ would affect the channel conductance in the same way as common changing of both gate voltages $V_{G2}$ or $V_{G1}$, in other words, the function would become linear, and the effects of both the offset voltage and common mode voltage would only sum up and would not have a strongly non-linear effect as now appears in equation (16). Due to the basic hypotheses, the coefficient $(V_{GS2}-V_T)/(V_{G2}-VG_1)$ of equation (16) is always <1.

Figure 6:
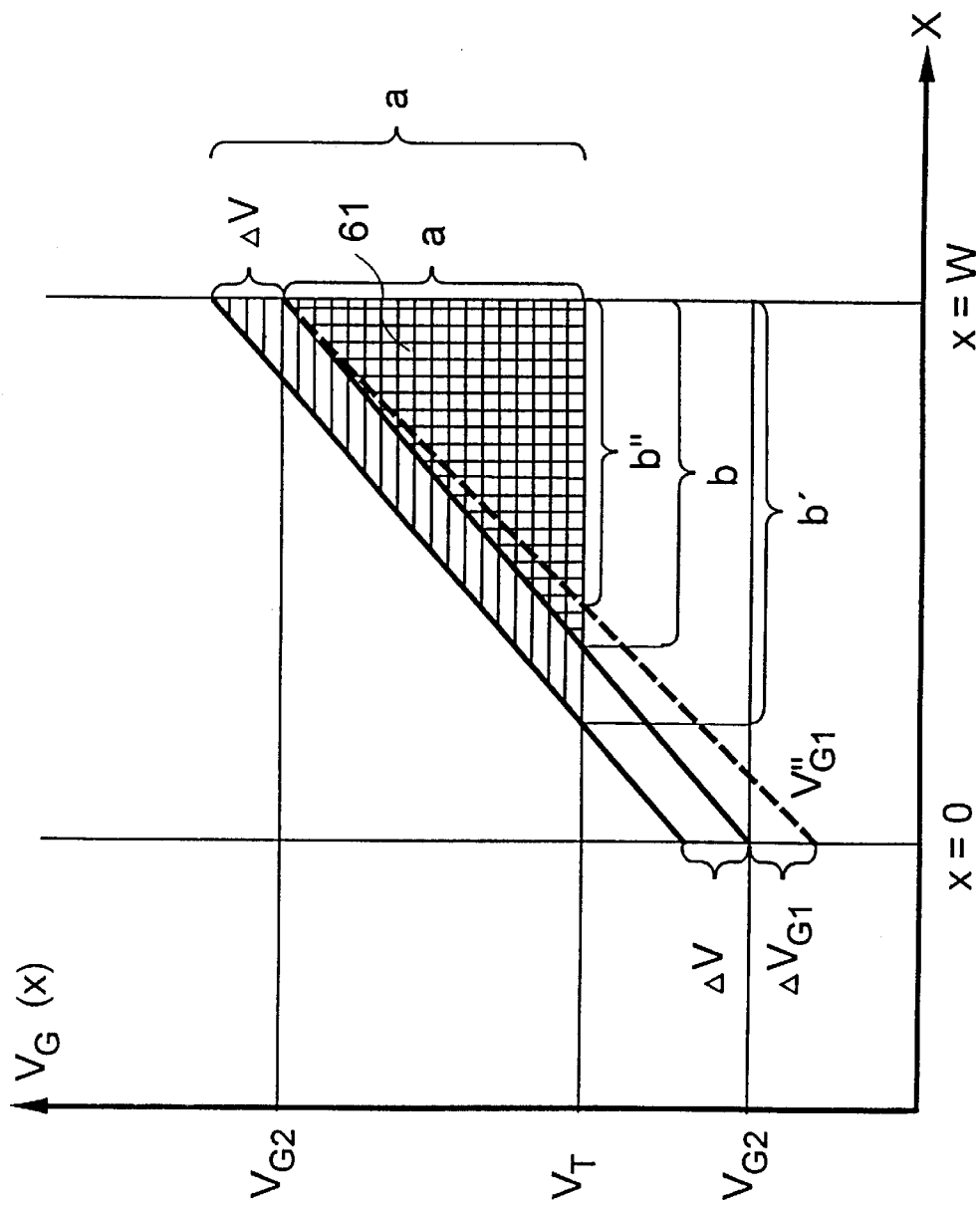
FIG. 6 shows the gate voltage of a field-effect transistor in accordance with the invention as a function of location in direction of width of the transistor gate.

Transistor function in accordance with equation (16) is illustrated in FIG. 6, which shows gate voltage $V_G$ as a function of position x in the direction of the transistor gate width: $V_G(x)$. In the linear function area, the conductance of the channel is proportional to the gate voltage integral exceeding the value $V_T$-$V_S$. At the beginning, let the gate voltages be $V_{G1}$ and $V_{G2}$, in which case the channel conductor is proportional to the area ½ ab of the triangle 61, bounded by dotted line. When changing the common gate voltage by dV, the length of both sides of the triangle representing channel conductance increases in the same proportion as the values a' and b' and, correspondingly, conductance increases proportionally to their product ½ a'b', in other words quadratically. When changing the offset voltage, affecting over the gate, so that $V_{G2}$ remains constant and the gate voltage $V_{G1}$ is changed to the value $V''_{G1}$, the side a of the triangle representing conductance remains unchanged and the other side changes to the value b", according to the equation (5), inversely proportional to the offset voltage $V_{G2}$-$V_{G1}$. As a result, channel conductance, which is proportional to the product ½ ab", decreases and is inversely proportional to the offset voltage.

In a circuit where the offset voltage $V_{G2}$-$V_{G1}$ is kept constant but the gate voltage $V_{G2}$ changes within the limits of the above examination, generally in the region below 1V, the current/voltage equation of a four-terminal field-effect transistor is quadratic in relation to the gate voltage $V_{G2}$, strongly non-linear, and further includes the coefficient $V_D$-$V_S$. In this case, the transistor may be used as a non-linear mixer, so that the sum of the signals to be mixed is conducted so as to be the gate voltage $V_{G2}$. When compared to the normal use of a field-effect transistor in the so-called linear region according to equation (2), the following difference is detected: the component based on the invention presented here may already be essentially quadratic at small $V_D$-$V_S$ and $V_{GS}$ values whereas a prior art three-terminal field-effect transistor is in the linear or triode area. Quadratic function with a prior art three-terminal transistor requires that $V_D$-$V_S$>$V_{GS}$-$V_T$, which generally requires the difference $V_D$-$V_S$ to be in the range of 2V or above. A circuit based on the invention, thus operates at a lower supply voltage circuit.

Equation (16) also shows that the current $I_{DS}$ of the transistor may be directly modulated by an offset voltage $V_{G2}$-$V_{G1}$, brought on the gate and, when the change of the offset voltage change is small as compared to the actual offset voltage, the change is approximately linear, more linear than the quadratic dependence with the voltage $V_{G2}$. The multiplication of a radio frequency signal by a signal at lower frequency may be given as a specific application for the transistor in accordance with the invention. This can be performed so that a voltage corresponding to the inverse of the desired multiplying signal at a low frequency is connected for the offset signal $V_{G2}$-$V_{G1}$, and the radio frequency signal to be multiplied is conducted on the gate as a common voltage, with its voltage value essentially corresponding to the voltage $V_{G2}$. Due to the quadratic non-linearity of the component according to the invention, the second harmonic component is detected in the radio frequency signal, apart from the fundamental frequency, so that the amplitude of both the fundamental frequency and the harmonic component depend on the inverse of the offset voltage. With regard to the inverse of the offset voltage, the circuit, thereby, performs a linear multiplication, which will be needed, for example, in generating phase/amplitude modulations for telecommunications. The frequency of the other signal to be multiplied is essentially doubled while using the invented transistor component in a strongly quadratic mode of function.

For the realisation of a two-dimensional gate potential, two different solutions are presented below.

Figure 7B:
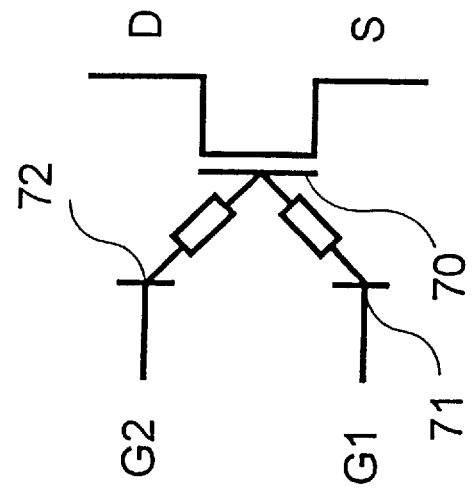
FIG. 7b shows the principle of the circuit achieved by a field-effect transistor in accordance with the invention.
Figure 7A:
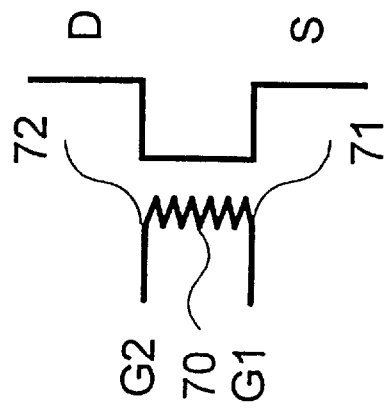
FIG. 7a shows the realization of a field-effect transistor in accordance with the invention at a symbolic level.

According to one embodiment of the invention, a simple method to realise a two-dimensional gate potential is to contact a gate electrode in the W direction at both ends and to conduct one voltage component into both gate contacts as a common voltage υ and to feed the other voltage component as the offset voltage Vd between the gate contacts, in which case the current of the transistor, independent of the voltage value $V_{DS}$, is proportional to the common voltage $V_C$ and is, additionally, proportional to the offset voltage $V_d$. Thus, the common-mode voltage υ affects the voltage level in the entire gate area (ie. adjusts the voltage to a certain level) and the offset voltage Vd affects the voltage difference between the gate ends in the direction of the gate width (i.e. adjusts the voltage difference to a desired level). This can be realised by a solution based on FIGS. 7a, 7b ja 4, where the gate 70 of the field-effect transistor is contacted in the direction of width, at both ends, by contacts 71 and 72 (ie. G1 and G2). Although the transistor's width direction i.e. W-direction is actually perpendicular in relation to the symbol presented on paper, in other words, it is perpendicular in relation to the surface of the paper, the arrangement is demonstrated in FIG. 7a by contacts placed at the ends of the gate. An optional suggestion for the symbol, which shows the actual geometry, is presented in FIG. 7b. In the embodiment presented in FIGS. 7a, 7b and 4, the two-dimensionality of the transistor's gate structure is utilized according to the invention only in the direction of width of the gate by using the gate contacts G1 and G2 placed at both ends of the gate, with the aid of which a desired voltage distribution can be produced in the direction of width of the gate.

Figure 1A:
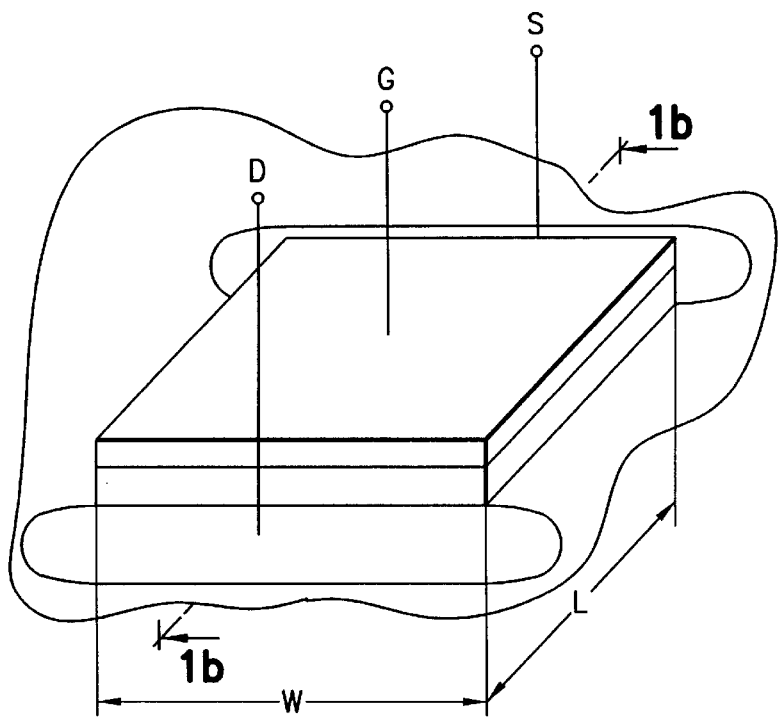
FIG. 1a shows the structure of a known field-effect transistor.
Figure 1B:
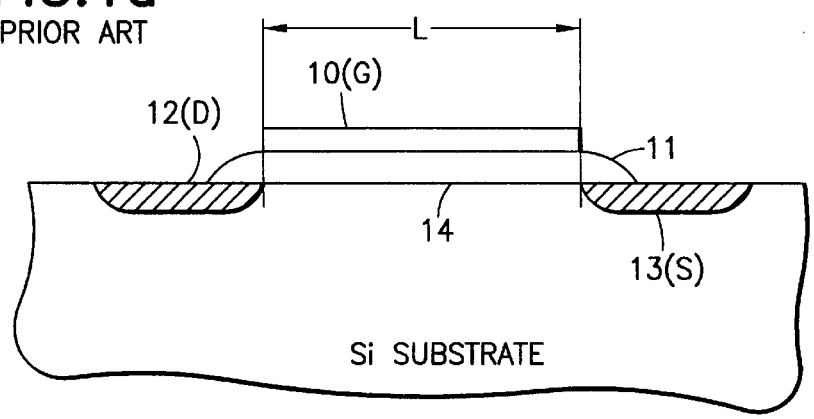
FIG. 1b shows the cross section of a known field-effect transistor structure.
Figure 1C:
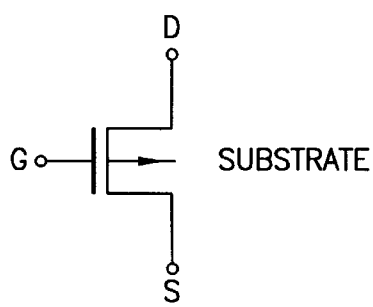
FIG. 1c shows the electric symbol of a known field-effect transistor.
Figure 8:
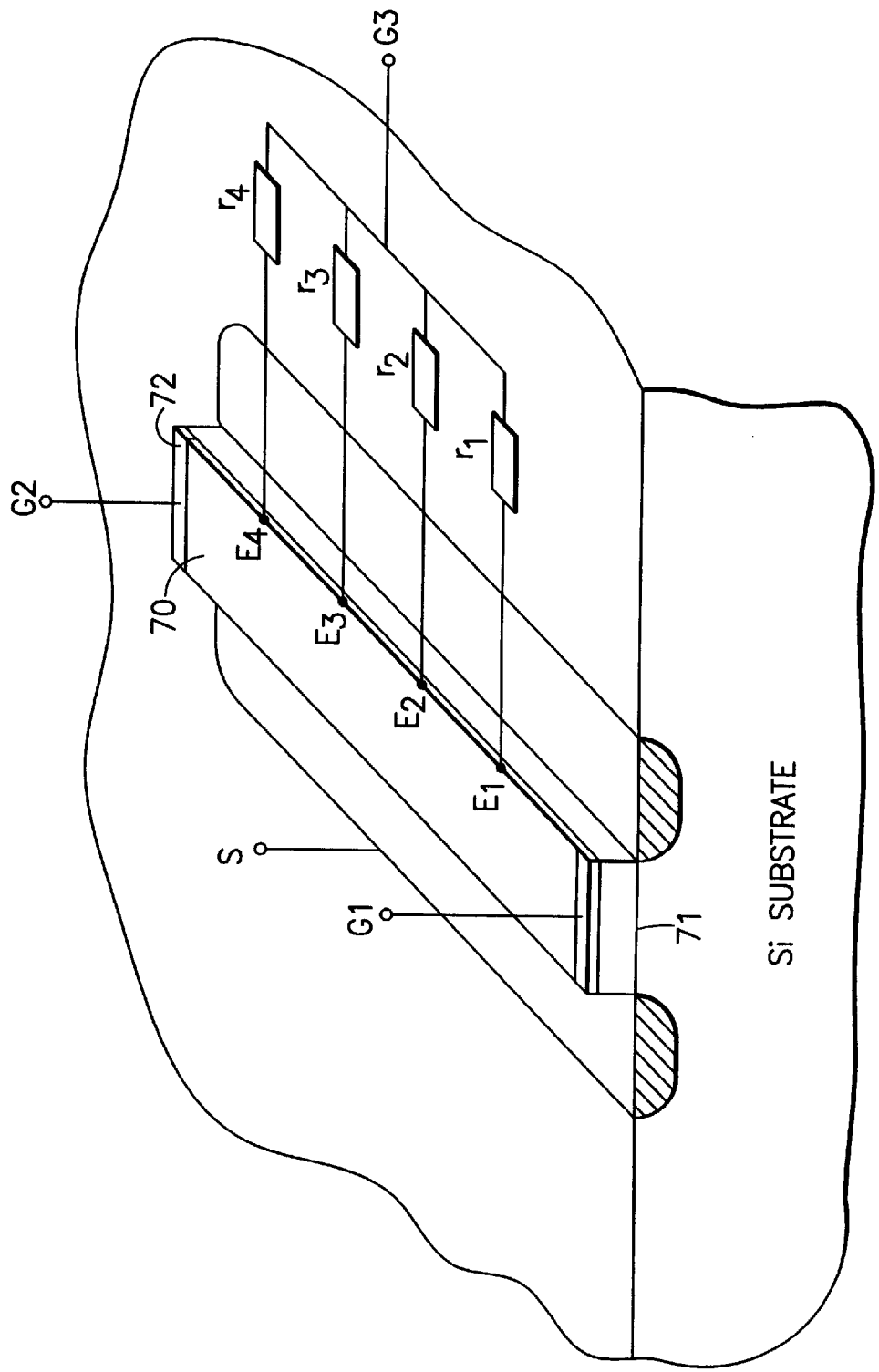
FIG. 8 shows an implementation according to an embodiment of the invention.
Figure 9B:
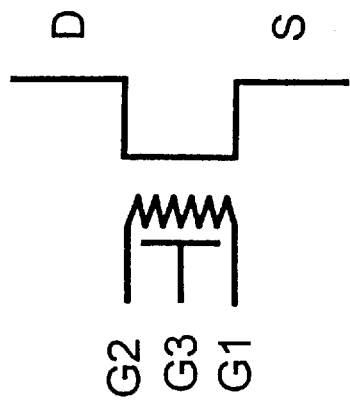
FIG. 9b shows an idea of the invention as an electric symbol.
Figure 9A:
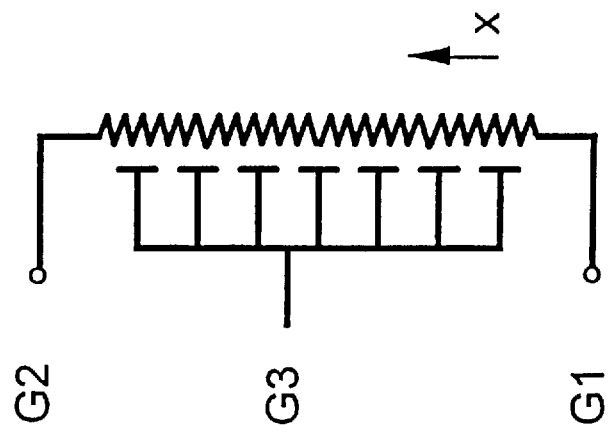
FIG. 9a shows an idea according to an embodiment of the invention as an electric symbol.

According to another embodiment of the invention, which is an optional method for the above-mentioned structure, the offset voltage $V_{G2}$-$V_{G1}$ is brought on the gate with the help of electrodes 71 and 72 (G1 and G2) in the W-direction, and the common voltage υ is brought on the gate with the help of conductive or capacitively coupled electrodes E1–E4 located at certain intervals in the lateral direction of the gate width. One of the options of realising this solution is shown in FIG. 8. In particular, when dealing with radio frequencies, capacitative coupling is an efficient method. In integrated circuits with the density of the capacitance between the gate electrode G and the transistor's channel being in the order of about 1 fF/$\mu$m$^2$ and the gate dimensions being W=100 $\mu$m, L=1 $\mu$m, the total capacitance of the gate would be about 0.1 pF and the resistance about 3 k$\Omega$. This type of gate would form an RC-low-pass filtering with cut-off frequency 500 MHz. In FIG. 8 is presented schematically a resistive coupling to the gate (by resistances r1–r4) in order to realise common voltage υ on the gate potential. Similarly, FIG. 9a presents a capacitive coupling in order to realise common voltage υ on the gate potential. FIG. 9b shows the suggested symbols for the components. A person skilled in the art is familiar with the realisation of capacitive coupling as such, in other words, the gate layer 10 in FIG. 1b would first be covered with an insulating layer and then with a conducting layer, which would be capacitatively connected to the gate layer 10 through the insulating layer. In the embodiment presented in FIGS. 8, 9a and 9b, the two-dimensionality of the transistor's gate structure is utilized according to the invention in the direction of the gate width, with the help of gate contacts G1 and G2 located at both ends of the gate and gate contact G3 located on top of the gate; with the help of these contacts, the desired voltage distribution can be realised in direction of the gate width. Naturally, the solution shown in FIGS. 8, 9a and 9b can also be used in accordance with the first embodiment described above, ie. without using the third gate contact G3.

Figure 10:
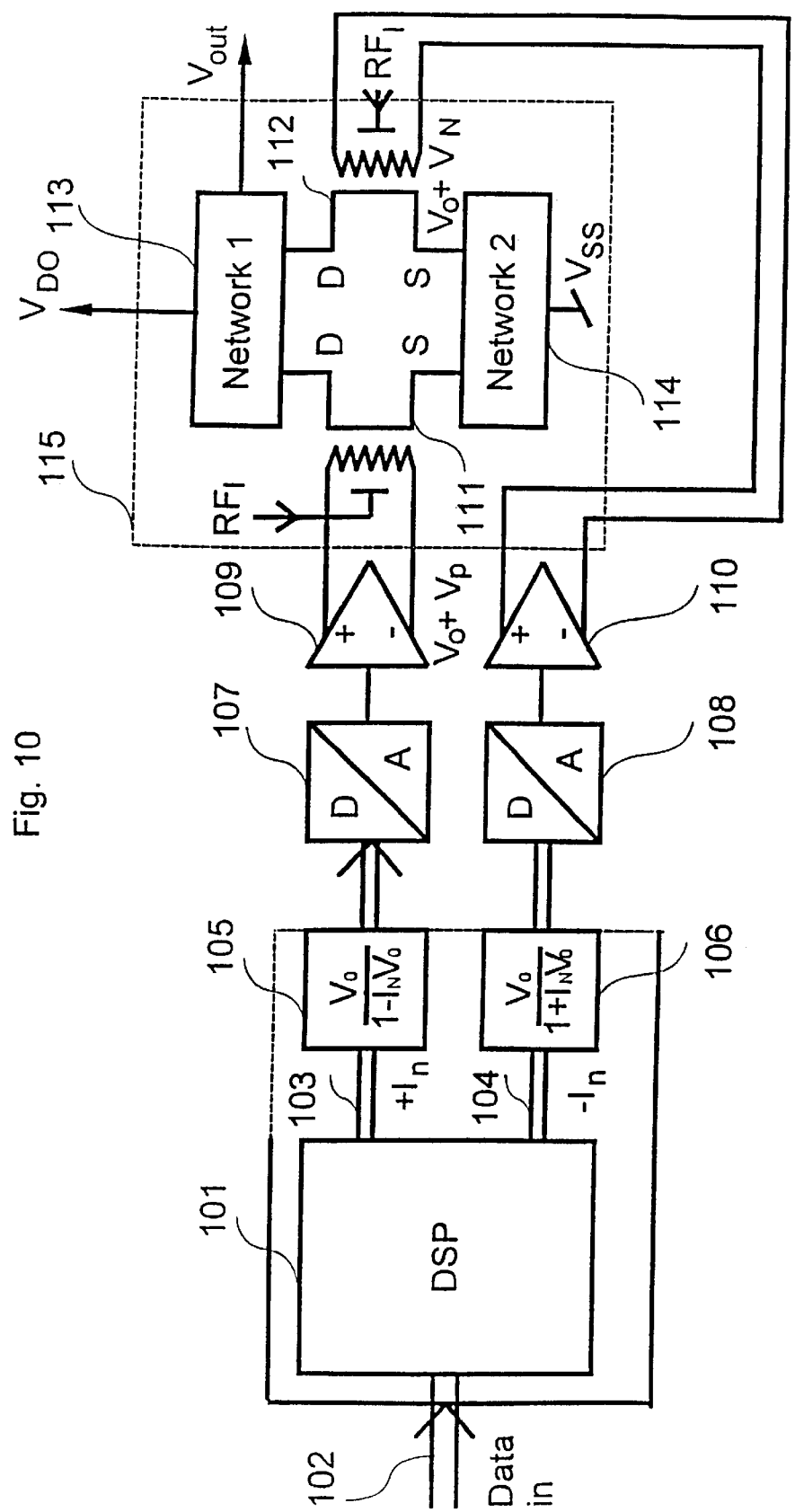
FIG. 10 shows a circuit for carrying out a differential signal multiplication function utilizing a field-effect transistor in accordance with the invention in connection with the generation of I/Q modulation.

For the component according to the invention, there are numerous application possibilities in signal processing and radio devices. Particularly suitable are applications where common mode voltage (VG3 or υ) is of radio frequency and offset voltage Vd=$V_{G2}$-$V_{G1}$ is of low frequency, for example, the amplitude signal around the zero frequency of a known IQ modulation. FIG. 10 shows as an example the realisation of the multiplication function of differential signals used in generating a known phase-amplitude modulation on the basis of the component in accordance with the invention.

In FIG. 10, the signal processor 101 generates, on the basis of the input data bit sequence 102, the signals 103 and 104 corresponding to the desired digital modulation, for example the signal values $I_n$(tn) and $-I_n$(tn). Because the control of the transistors is always based on a unipolar signal (e.g., a positive gate potential), the signals are transformed to unipolar in the calculation means 105 and 106, so that, at the same time, according to equation (16), the inverted linearity of a differential multiplying amplifier is accounted for. Voltage changes $V_P$ and $V_N$, which control the differential stage 115, are set according to the following equations;

$$I_n = \frac{1}{V_o} - \frac{1}{V_o + V_P} \qquad (20)$$

$$-I_n = \frac{1}{V_o} - \frac{1}{V_o + V_N} \qquad (21)$$

where $V_0$ is the offset voltage operating over the gate of the transistors with the control signal value $I_n(t_n)$=0. From the above, the desired values $V_P$ and $V_N$ are solved $$V_P = \frac{V_0^2 I}{1 - I_N V_0} \qquad (22)$$

$$V_N = \frac{-V_0^2 I_N}{1 - I_N V_0} \qquad (23)$$

Due to inverted linearity, the differential output signal of the differential stage 115 is $$V_{out} \approx k \left( \frac{1}{V_0 + V_P} - \frac{1}{V_0 + V_N} \right) * V_{RFI}. \qquad (24)$$

By adding $V_0$ to equations (22) and (23), the following calculations are achieved to be performed in the calculation units 105 and 106

$$V_P + V_0 = \frac{V_0}{1 - I_N V_0} \qquad (25)$$

$$V_N + V_0 = \frac{V_0}{1 + I_N V_0}, \qquad (26)$$

in which case, as output of the differential stage 115 is achieved according to equation (24)

$$V_{out} = -2kI_N * V_{RFI} \qquad (27)$$

in other words, the desired linear multiplication function with signs. The transformation based on equations (25) and (26) from linear differential signal values $I_N$ and $-I_N$ with signs, to non-linear and unipolar controls for multiplying transistors 111 and 112 according to the invention, is performed in blocks 105 and 106, the results received from these units are converted to analog signals in converters 107 and 108, and, when necessary, are amplified to differential signals in differential amplifiers 109 and 110, the outputs of which create the offset voltage $V_{G2}$-$V_{G1}$ in direction of width over the gates of the field-effect transistors 111 and 112 according to the invention. Similarly, the voltage $V_{RFI}$ to be brought to the inputs RFI corresponds to the common voltage υ according to the invention. The other parts 113 and 114 of the differential amplifier stage are commonly known, for example, from the book E. Oxner (Siliconix, Inc. Designing with Field-Effect Transistors, 2nd Edition (published by McGraw-Hill, 1990).

It is obvious to a person skilled in the art that the example in FIG. 10 can, in practice, be realised in a number of optional ways and that in the circuit, the essential addition to prior art is related to the structure and mode of use of transistors 111 and 112, as well as with the linearisation of functions in means 105 and 106.

This disclosure presented the basic function of the invented component and, on the basis of simplified examples, described its realisation and versatile usability. The advantages of the component and the methods and circuits using it are simplicity, small size, low current consumption, strong non-linearity, multiplication facility by one transistor, operation on low supply voltage and the feasibility of using simple and advantageous CMOS technology. Feasibility and usage of the invention are, therefore, limited only by the enclosed claims.

It is obvious to a person skilled in the art that the invention is not restricted to details of the embodiments presented above, and that the invention can also be realised in another form without deviating from the characteristics of the invention. Thus, the embodiments presented should be considered illustrating but not restricting. Consequently, the various options of realising the invention as determined by the claims, including the equivalent realisations, also belong to the scope of the invention.

I claim:

1. A field-effect transistor comprising a drain (D) and a source (S) and a gate (G) with a determined width (W) and length (L), said gate length being formed in direction of a first axis going through the drain (D) and the source (S), said transistor having a channel disposed along said first axis for conduction of current between said drain and said source, said width being measured in a direction of a second axis perpendicular to said first axis, said gate having plural terminals disposed spaced apart from each other along said second axis, and said gate (G) being responsive, in direction of its width, to a voltage distribution applied via said plural gate terminals for adjusting channel width of of said channel.

2. A field-effect transistor according to claim 1, wherein the gate comprises a first end and a second end located essentially opposite said first end, and at said first end a first gate contact (G1) is connected to the gate and at said second end a second rate contact (G2) is connected to the gate, wherein the field-effect transistor comprises only one gate and below the gate between the drain (D) and the source (S) a channel conducting electricity in direction of length of the gate can be generated by fulfilling certain predetermined criteria, and the width of the channel is adjustable with a difference voltage $(V_{G1}-V_{G2})$ which can be generated as the difference between a first voltage $(V_{G1})$ provided at said first rate contact (G1) and a second voltage $(V_{G2})$provided at said second rate contact (G2).

3. A field-effect transistor according to claim 1, wherein it comprises means (G1, G2, G3) for creating a common-mode potential (υ) in the gate area.

4. A field-effect transistor according to claim 3, wherein it comprises several electrodes (E1–E4) coupled to the gate and connected to each other to form a third gate contact (G3), and for generating a determined potential $(V_{G3}, υ)$ evenly in the gate area.

5. A field-effect transistor according to claim 4, wherein said electrodes (E1–E4) have been connected to the gate (G) through resistances (r1–r4).

6. A field-effect transistor according to claim 3, wherein it comprises a third gate contact (G3) capacitively coupled to the gate area for generating a determined potential $(V_{G3}, υ)$ evenly in the gate area.

7. A field-effect transistor according to claim 3, wherein it comprises an output (D, S) for outputting a signal $(I_{DS})$ proportional to the product of said difference voltage $(V_{G1}-V_{G2})$ and said common-mode potential (υ).

8. A field-effect transistor according to claim 4, wherein it comprises an output (D, S) for outputting a signal $(I_{DS})$ proportional to the product of said difference voltage $(V_{G1}-V_{G2})$ and said potential $(V_{G3})$ to be brought to said third gate contact (G3).

9. A multiplier for multiplying two signals by each other, wherein the multiplier comprises a field-effect transistor comprising a drain (D) and a source (S) and a gate (G) with a determined width (W) and length (L);

said gate length is formed in direction of a first axis going through the drain (D) and the source (S), said length being measured along said first axis;

said transistor having a channel disposed along said first axis for conduction of current between said drain and said source, said width being measured in a direction of a second axis perpendicular to said first axis, said gate having plural terminals disposed spaced apart from each other along said second axis;

said gate G has in direction of its width a first end and a second end located essentially opposite said first end, and at said first end a first gate contact (G1) is connected to the gate and at said second end a second gate contact (G2) is connected to the gate;

the multiplier providing an output signal at one of the drain (D) and source (S) of the field-effect transistor;

said output signal is a product of a first and a second signal;

said first signal is proportional to a difference voltage $(V_{G1}-V_{G2})$ which can be generated as the difference between a first voltage $(V_{G1})$ provided at the said first gate contact (G1) and a second voltage $(V_{G2})$ provided at said second gate contact (G2); and said second signal is the common-mode voltage of said first voltage $(V_{G1})$ provided at the said first gate contact (G1) and said second voltage $(V_{G2})$ provided at said second gate contact (G2).

10. A field-effect transistor comprising a drain, a source, and a gate interposed along a path of current flow between the source and the drain, wherein the transistor further comprises a first electrode connecting with said gate on a first side of said path and a second electrode connecting with said gate on a second side of said path opposite the first side of said path, wherein said first electrode and said second electrode are located on a line extending in a first direction normal to said current path, and wherein a region of said gate is responsive to energization of said first and said second electrodes for generating a voltage distribution in said first direction normal to said path in response to energization of said first and said second electrodes with a difference of electrical potential, the voltage distribution establishing a width of gate channel along said path for control of a magnitude of current flowing in the transistor between said source and said drain.

* * * * *

UNITED STATES PATENT AND TRADEMARK OFFICE
CERTIFICATE OF CORRECTION

PATENT NO. : 5,831,303
DATED : Nov. 3, 1998
INVENTOR(S) : Rapeli

It is certified that error appears in the above-identified patent and that said Letters Patent is hereby corrected as shown below:

In column 9, line 49, the word "rate" should be changed to --gate--
In column 9, line 57, the word "rate" should be changed to --gate--
line 58, the word "rate" should be changed to --gate--.

Signed and Sealed this

Fourth Day of May, 1999

Attest:

Q. TODD DICKINSON

Attesting Officer

Acting Commissioner of Patents and Trademarks